(12) United States Patent
Lin

(10) Patent No.: US 8,835,264 B1
(45) Date of Patent: Sep. 16, 2014

(54) METHOD FOR FABRICATING POWER SEMICONDUCTOR DEVICE

(71) Applicant: Anpec Electronics Corporation, Hsin-Chu (TW)

(72) Inventor: Yung-Fa Lin, Hsinchu (TW)

(73) Assignee: Anpec Electronics Corporation, Hsinchu Science Park, Hsin-Chu (TW)

( * ) Notice: Subject to any disclaimer, the term of this patent is extended or adjusted under 35 U.S.C. 154(b) by 0 days.

(21) Appl. No.: 13/902,851

(22) Filed: May 26, 2013

(30) Foreign Application Priority Data

Apr. 9, 2013 (TW) ............... 102112542 A

(51) Int. Cl.
*H01L 21/336* (2006.01)
*H01L 21/22* (2006.01)
*H01L 21/762* (2006.01)
*H01L 29/66* (2006.01)
*H01L 21/225* (2006.01)

(52) U.S. Cl.
CPC ...... *H01L 29/6653* (2013.01); *H01L 21/76224* (2013.01); *H01L 29/66666* (2013.01); *H01L 21/225* (2013.01)

USPC ............ 438/296; 438/558; 438/561; 438/563

(58) Field of Classification Search
None
See application file for complete search history.

(56) References Cited

U.S. PATENT DOCUMENTS

2010/0184264 A1* 7/2010 Rhee .............................. 438/270

* cited by examiner

*Primary Examiner* — Scott B Geyer
(74) *Attorney, Agent, or Firm* — Winston Hsu; Scott Margo

(57) ABSTRACT

A substrate having thereon an epitaxial layer is provided. A hard mask having an opening is formed on the epitaxial layer. A sidewall spacer is formed within the opening. A first trench is etched into the epitaxial layer through the opening. A dopant source layer is formed on the surface of the first trench. The dopants are driven into the epitaxial layer to form a doped region within the first trench. The doped region includes a first region adjacent to the surface of the first trench and a second region farther from the surface. The entire dopant source layer and the spacer are removed. A sacrificial layer is then filled into the first trench. The sacrificial layer and the epitaxial layer within the first region are etched away to form a second trench.

14 Claims, 10 Drawing Sheets

METHOD FOR FABRICATING POWER SEMICONDUCTOR DEVICE

BACKGROUND OF THE INVENTION

1. Field of the Invention

The present invention relates generally to the field of semiconductor technology. More particularly, the present invention relates to a method for fabricating a power semiconductor device with super junction structure.

2. Description of the Prior Art

As known in the art, super junction power MOSFET devices include alternating p-type and n-type regions below the active regions of the device. The alternating p-type and n-type regions in a super junction power MOSFET device are ideally in charge balance so that those regions deplete one another under a reverse voltage condition, thereby enabling the device to better withstand breakdown.

It is known to utilize super junction structures in trench type power devices. To form such trench type super junction power devices, typically, deep trenches are etched into a main surface of a semiconductor substrate, and an epitaxial layer is then formed to fill the deep trenches. However, the prior art fabrication method has drawbacks. For example, the surface concentration of the dopants driven into the trench surfaces is too high. This leads to non-uniformity of the carrier concentration distribution.

SUMMARY OF THE INVENTION

It is therefore one object of the present invention to provide an improved fabrication method to form trench type power semiconductor devices in order to solve the above-mentioned overlay problems.

According to one embodiment, a method for fabricating a power semiconductor device is disclosed. A substrate having thereon an epitaxial layer is provided. A hard mask having an opening is formed on the epitaxial layer. A sidewall spacer is formed within the opening. A first trench is etched into the epitaxial layer through the opening. A dopant source layer is formed on the surface of the first trench. The dopants are driven into the epitaxial layer to form a doped region within the first trench. The doped region includes a first region adjacent to the surface of the first trench and a second region farther from the surface. The entire dopant source layer and the spacer are removed. A sacrificial layer is then filled into the first trench. The sacrificial layer and the epitaxial layer within the first region are etched away to form a second trench.

These and other objectives of the present invention will no doubt become obvious to those of ordinary skill in the art after reading the following detailed description of the preferred embodiment that is illustrated in the various figures and drawings.

DETAILED DESCRIPTION

In the following description, numerous specific details are given to provide a thorough understanding of the invention. It will, however, be apparent to one skilled in the art that the invention may be practiced without these specific details. Furthermore, some well-known process steps such as lithographic and etching processes are not disclosed in detail, as these should be well-known to those skilled in the art.

The terms wafer or substrate used herein includes any structure having an exposed surface onto which a layer may be deposited according to the present invention, for example, to form the integrated circuit (IC) structure. The term substrate is understood to include semiconductor wafers commonly used in this industry. The term substrate is also used to refer to semiconductor structures during processing, and may include other layers that have been fabricated thereupon. Both wafer and substrate may include doped and undoped semiconductors, epitaxial semiconductor layers supported by a base semiconductor or insulator, as well as other semiconductor structures well known to one skilled in the art.

Figure 1:
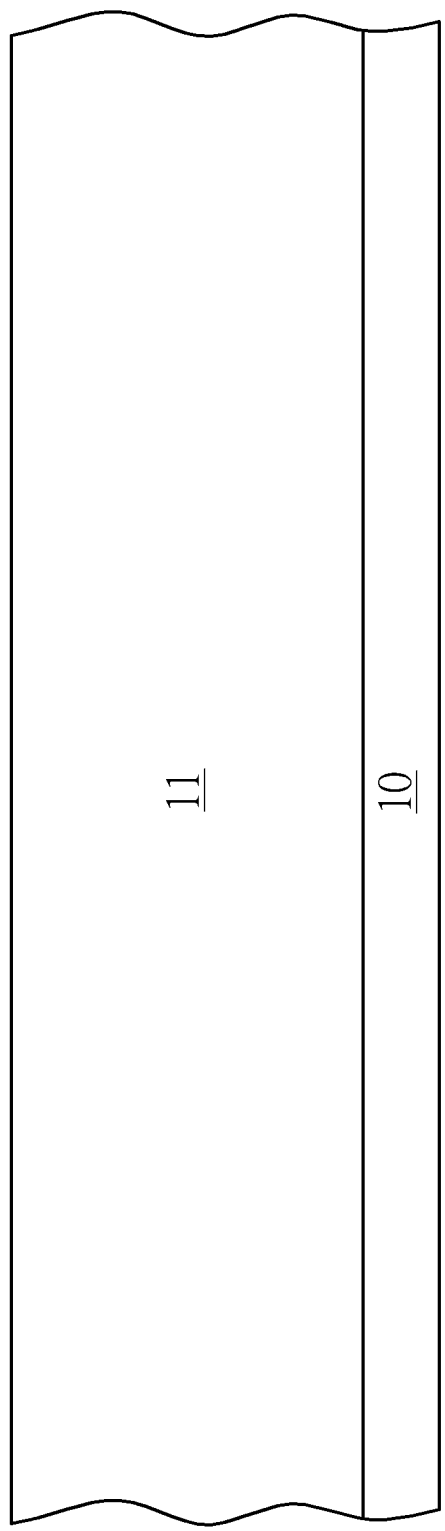
FIGS. 1-10 are schematic diagrams showing a method for fabricating a trench type power transistor device in accordance with one embodiment of the invention.

Please refer to FIGS. 1-10. FIGS. 1-10 are schematic diagrams showing a method for fabricating a trench type power transistor device in accordance with one embodiment of the invention. As shown in FIG. 1, a semiconductor substrate 10 having a first conductivity type is provided. For example, the semiconductor substrate 10 may be an N+ heavily doped silicon substrate or wafer and may be act as a drain of the transistor device. An epitaxial growth process is performed to form an epitaxial layer 11 such as an N type epitaxial silicon layer or a P type epitaxial silicon layer on the semiconductor substrate 10.

Figure 2:
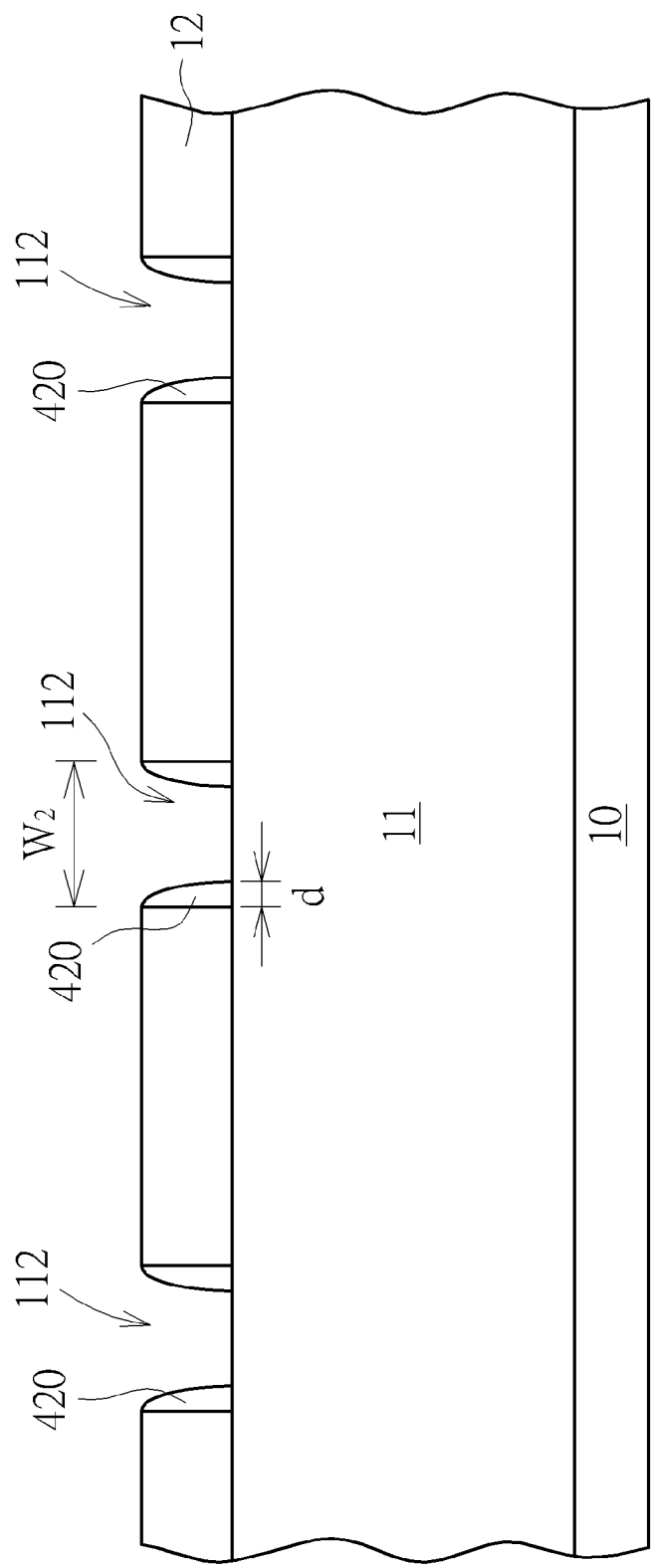

As shown in FIG. 2, a hard mask layer 12 such as a silicon nitride layer is formed on a top surface of the epitaxial layer 11. A lithographic process and an etching process are carried out to form openings 112 in the hard mask layer 12. For example, the openings 112 are straight line-shaped and each of the openings 112 has a width W2. Subsequently, a sidewall spacer 420 is formed on each sidewall of the openings 112. For example, the sidewall spacer 420 may be a silicon oxide spacer and has a width d (bottom width). According to the embodiment, the width d may be about 0.5 micrometers, but not limited thereto.

Figure 3:
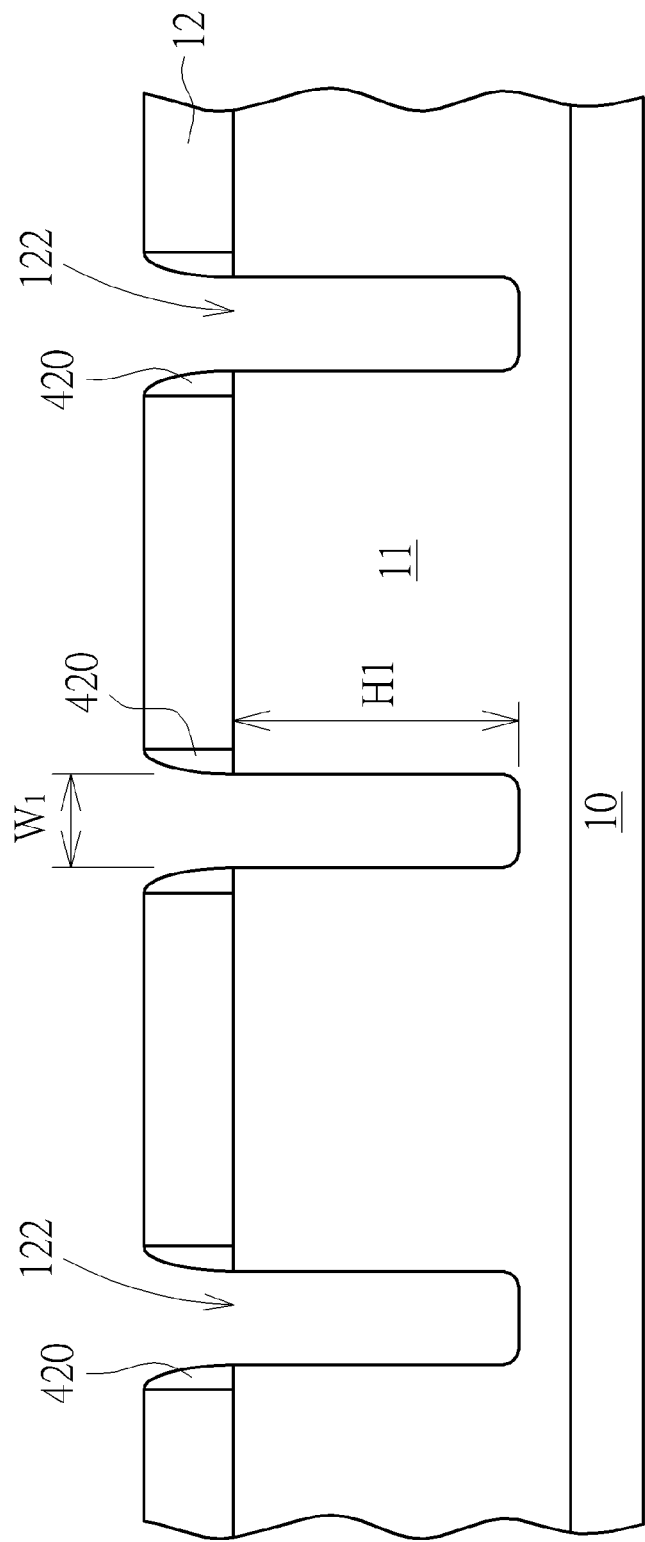

As shown in FIG. 3, a dry etching process is performed to etch the epitaxial layer 11 through the openings 112 in the hard mask layer 12 to a depth H1, thereby forming trenches 122. Each of the trenches 122 has a width W1 that is smaller than the width W2. The depth H1 is smaller than the thickness of the epitaxial layer 11.

Figure 4:
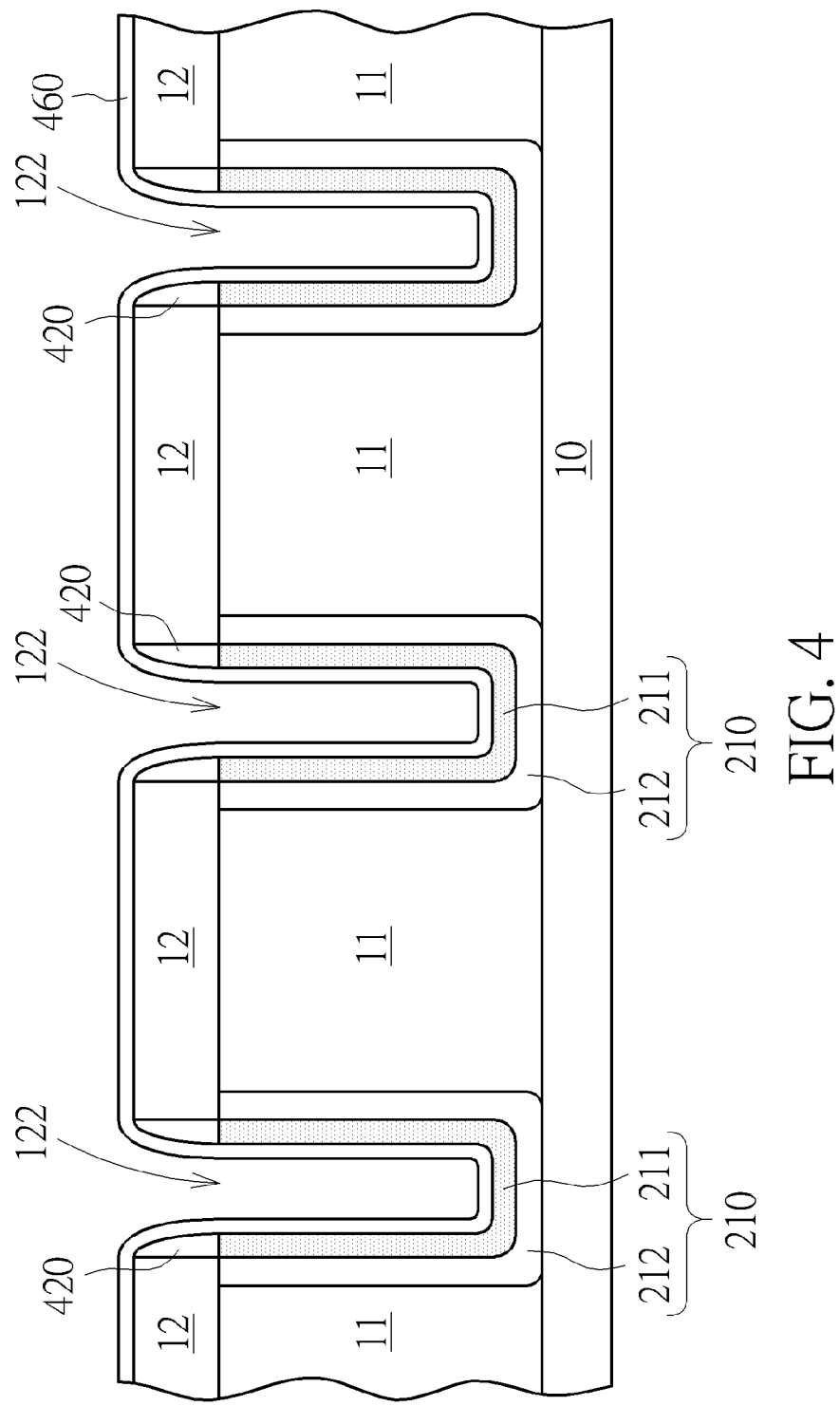

As shown in FIG. 4, a dopant source layer 460 is deposited on the interior surface of the trenches 122, the surface of the spacers 420 and the top surface of the hard mask layer 12. For example, the dopant source layer 460 may be a boron doped silicate glass (BSG) or phosphorus doped silicate glass (PSG) layer. According to the embodiment, the dopant source layer 460 has a conductivity type that is opposite to the conductivity type of the epitaxial layer 11. For example, when the epitaxial layer 11 is N type, then the dopant source layer 460 is P type doped, while when the epitaxial layer 11 is P type, then the dopant source layer 460 is N type doped. Subsequently, a high temperature diffusion process is performed to drive the dopants from the dopant source layer 460 into the epitaxial layer 11, thereby forming the PN super junction structure.

At this point, the diffusion region 210 diffused into the epitaxial layer 11 includes a first region 211 that is closer to the surface of the trench 122 and a second region 212 that is formed deeper into the epitaxial layer 11. The first region 211 has a doping concentration that is higher than that of the second region 212. For example, the doping concentration of the first region 211 ranges between about 1E17 atoms/cm$^3$ and 1E19 atoms/cm$^3$, and the doping concentration of the second region 212 may be about 1E16 atoms/cm$^3$, but not limited thereto. According to the embodiment, the width of the first region 211 is substantially equal to the width d of the spacer 420.

Figure 5:
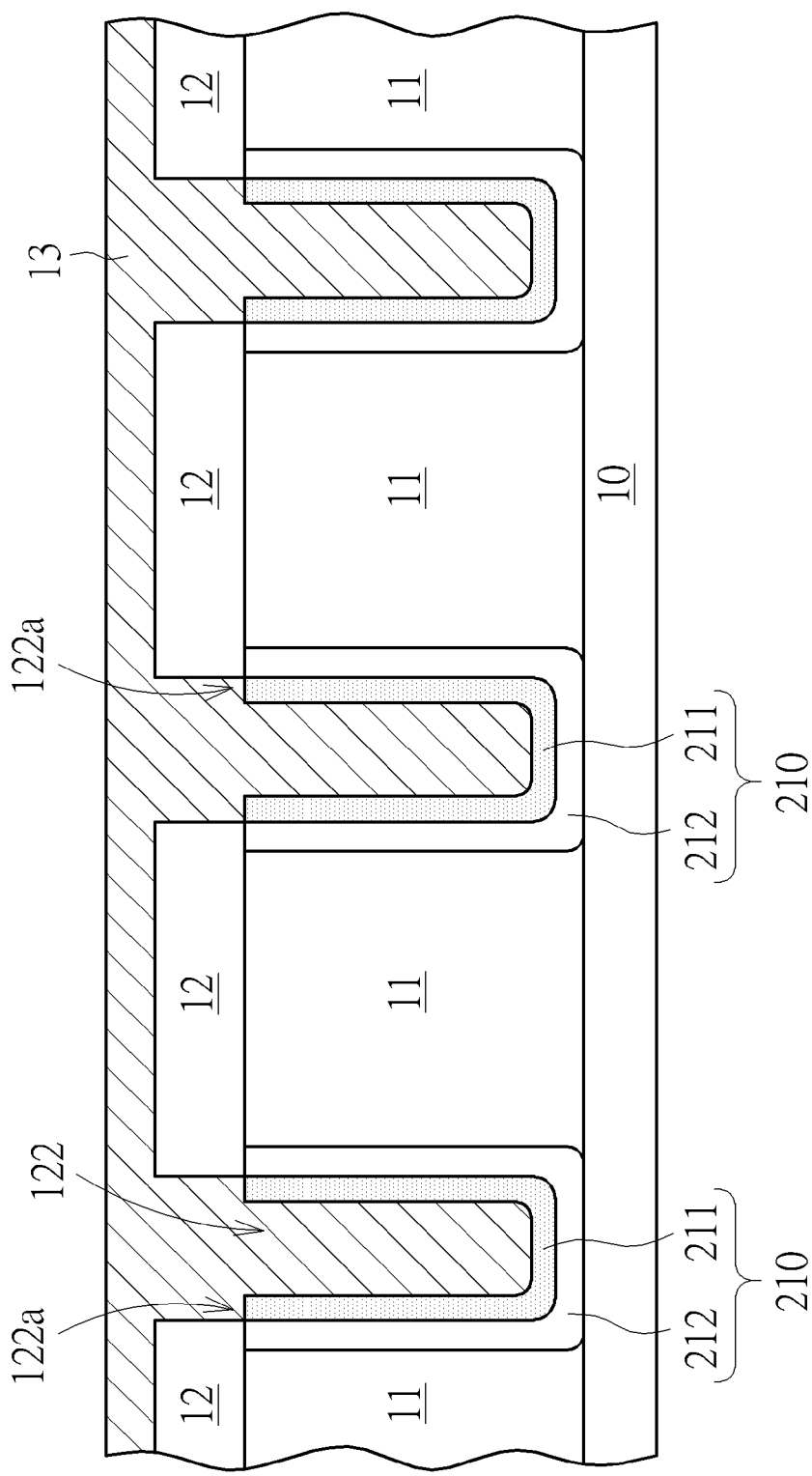

As shown in FIG. 5, the dopant source layer 460 and the spacers 420 are removed to thereby reveal the upper corner portions 122a of the trenches 122. Thereafter, a sacrificial layer 13 such as polysilicon is deposited to fill the trenches 122.

Figure 6:
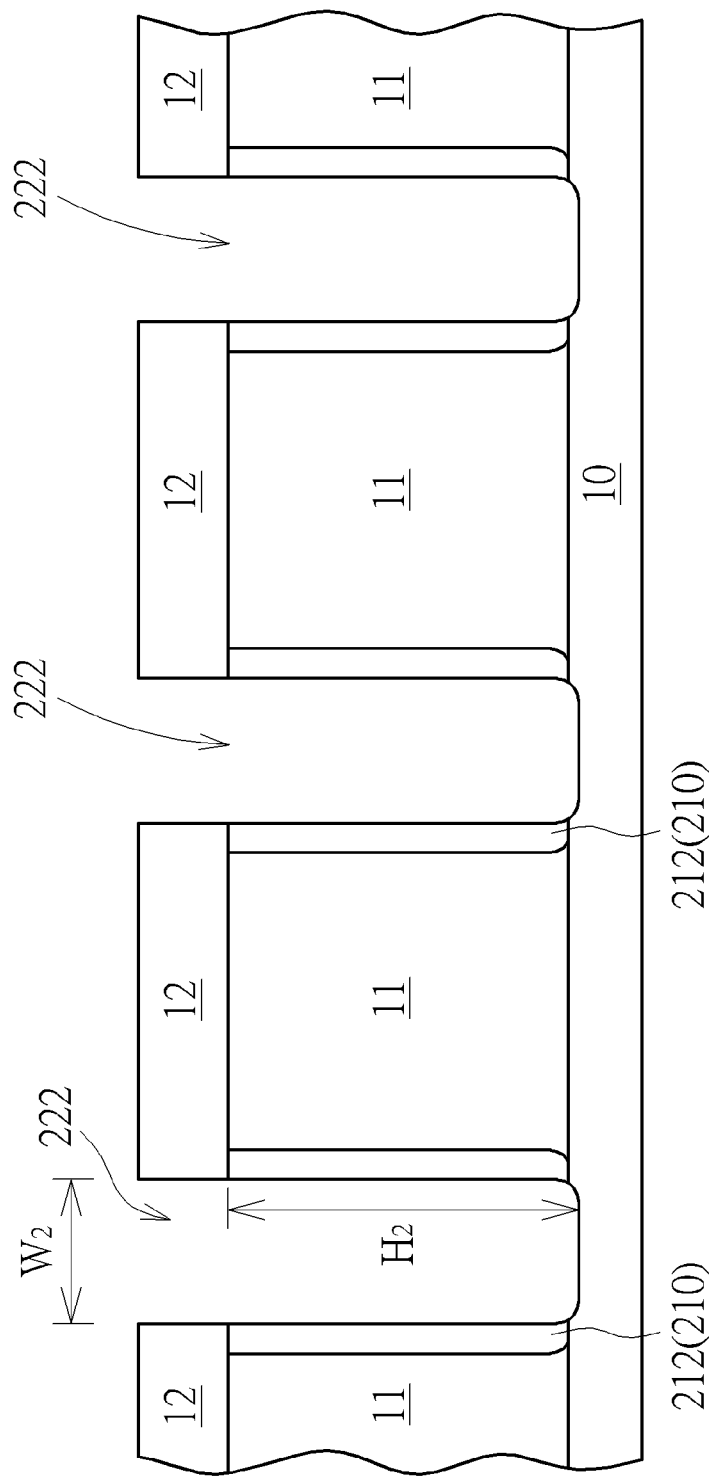

As shown in FIG. 6, a dry etching process is then performed, using the hard mask layer 12 as an etching hard mask, to completely etch away the sacrificial layer 13 and the epitaxial layer 11 in the first region 211, thereby forming trenches 222. The trench 222 has a width that is substantially equal to the width W2 of the opening 112. The trench 222 has a depth H2 that is greater than the depth H1 of the trench 122. The depth H2 may be greater than or equal to the thickness of the epitaxial layer 11. It is noteworthy that when the epitaxial layer 11 is N type, the aforesaid trenches 222 may have an etched depth either penetrating through the epitaxial layer 11 or not penetrating through the epitaxial layer 11. However, when the epitaxial layer 11 is P type, the trenches 222 has an etched depth that has to be penetrating through the epitaxial layer 11.

Figure 7:
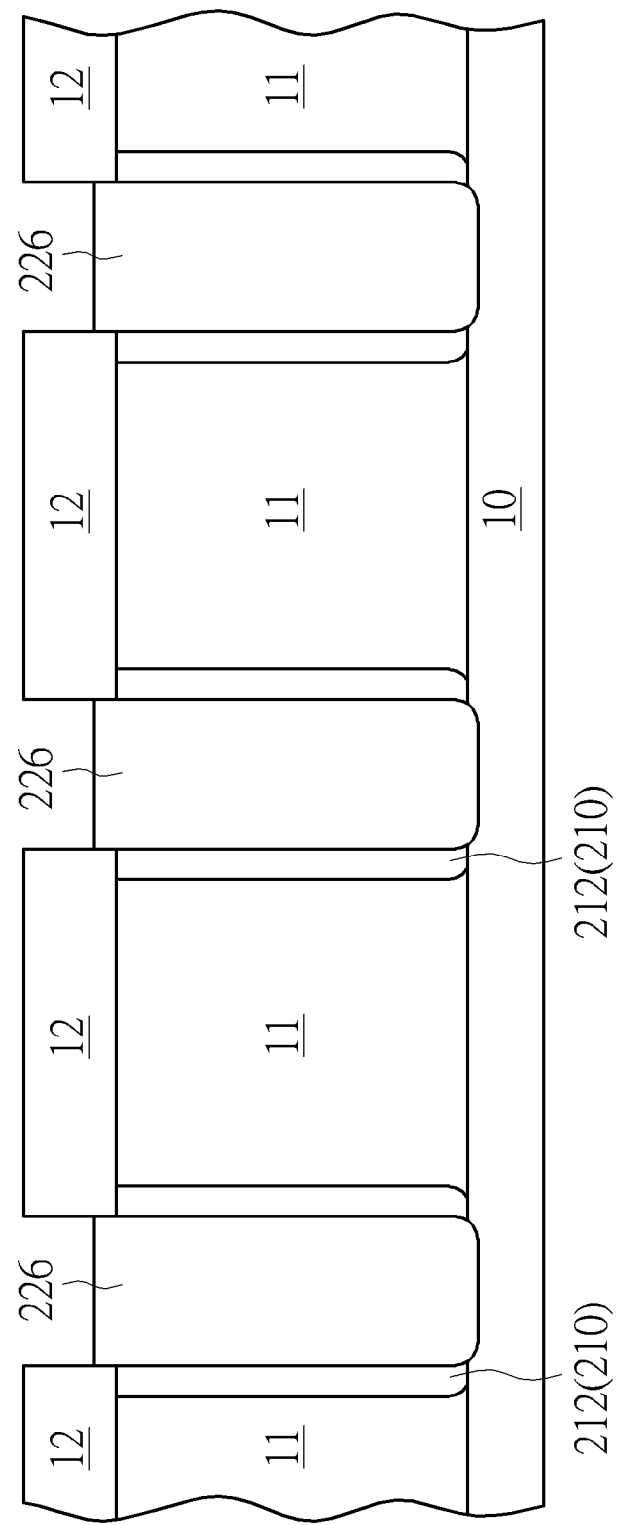

As shown in FIG. 7, a silicon oxide layer 226 is then deposited. The silicon oxide layer 226 fills the trenches 222. Prior to the deposition of the silicon oxide layer 226, an oxidation process may be performed to form a sacrificial layer (not shown) on the surface of the trenches 222. The sacrificial layer is then etched and removed. A chemical mechanical polishing (CMP) process is then performed to polish and remove the silicon oxide layer 226 from the surface of the hard mask layer 12. A portion of the silicon oxide layer 226 is then removed from the trenches 222 such that a top surface of the silicon oxide layer 226 is lower than the top surface of the hard mask layer 12.

Figure 8:
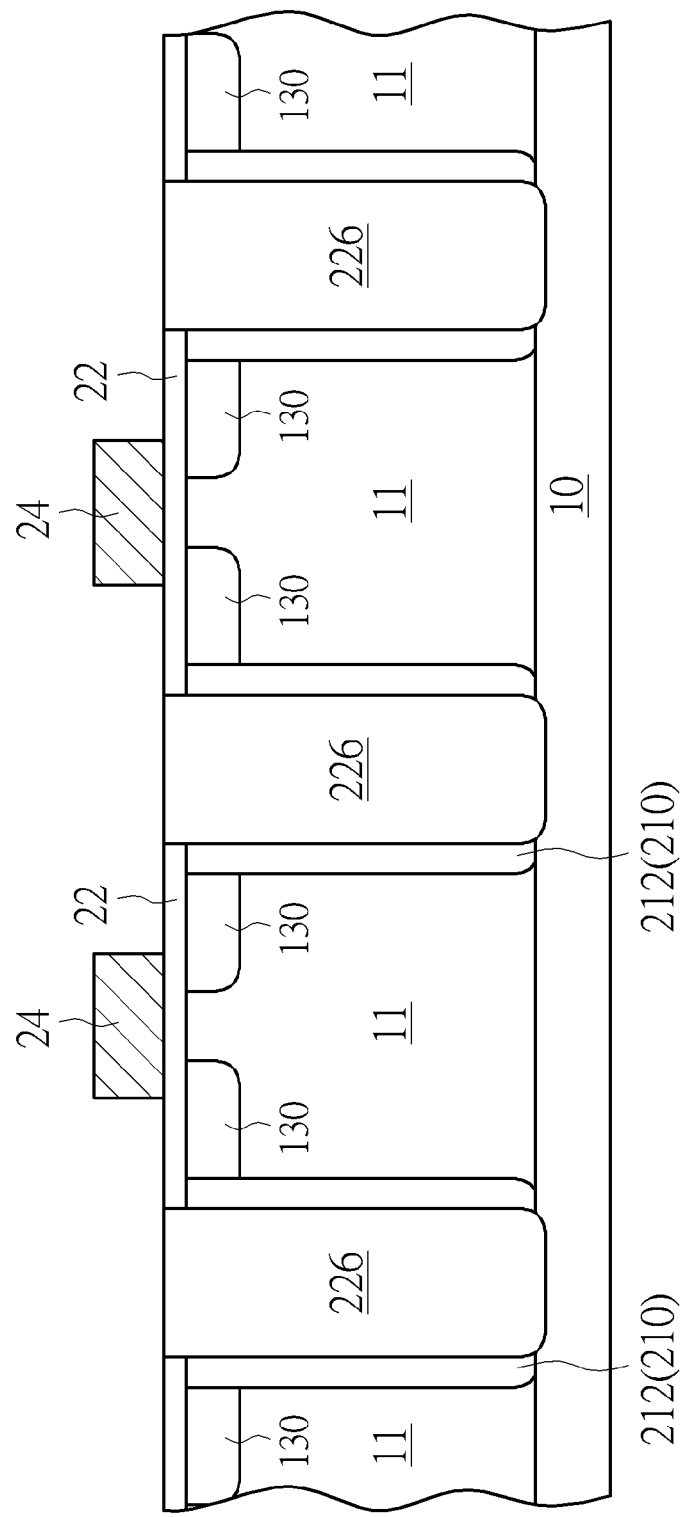

As shown in FIG. 8, the hard mask layer 12 is removed to reveal the top surface of the epitaxial layer 11. Subsequently, a gate oxide layer 22 and gates 24 are formed on the top surface of the epitaxial layer 11. According to the embodiment, the gates 24 may be polysilicon gates. An ion implantation process is then performed to implant dopants with the second conductivity type (e.g. P type) into the epitaxial layer 11 between two adjacent gates 24, thereby forming ion wells 130. Thereafter, a thermal drive-in process may be performed.

Figure 9:
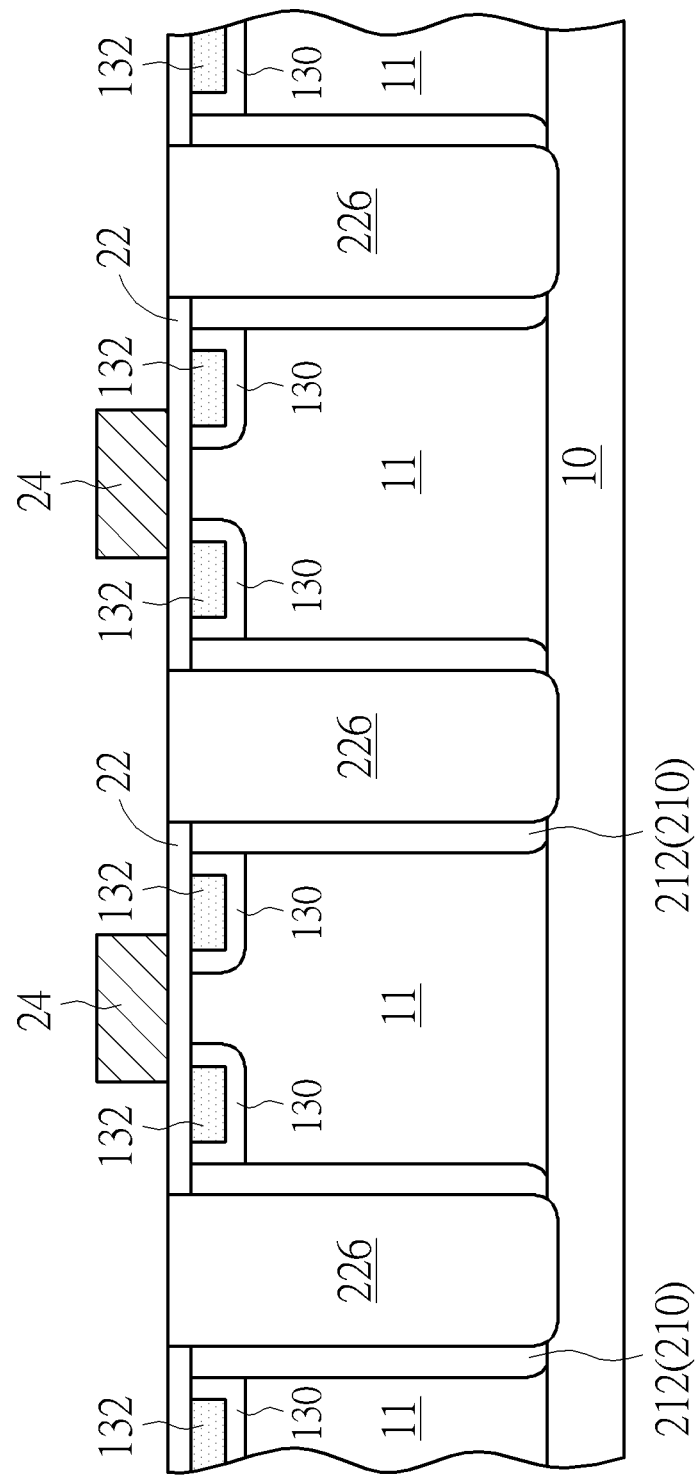

As shown in FIG. 9, by using a photoresist and a lithographic process, the regions to be formed as sources are defined. Subsequently, an ion implantation process is carried out to implant dopants with the first conductivity type (e.g. N type) into the ion wells 130, thereby forming the source doping regions 132. Thereafter, a thermal drive-in process may be performed.

Figure 10:
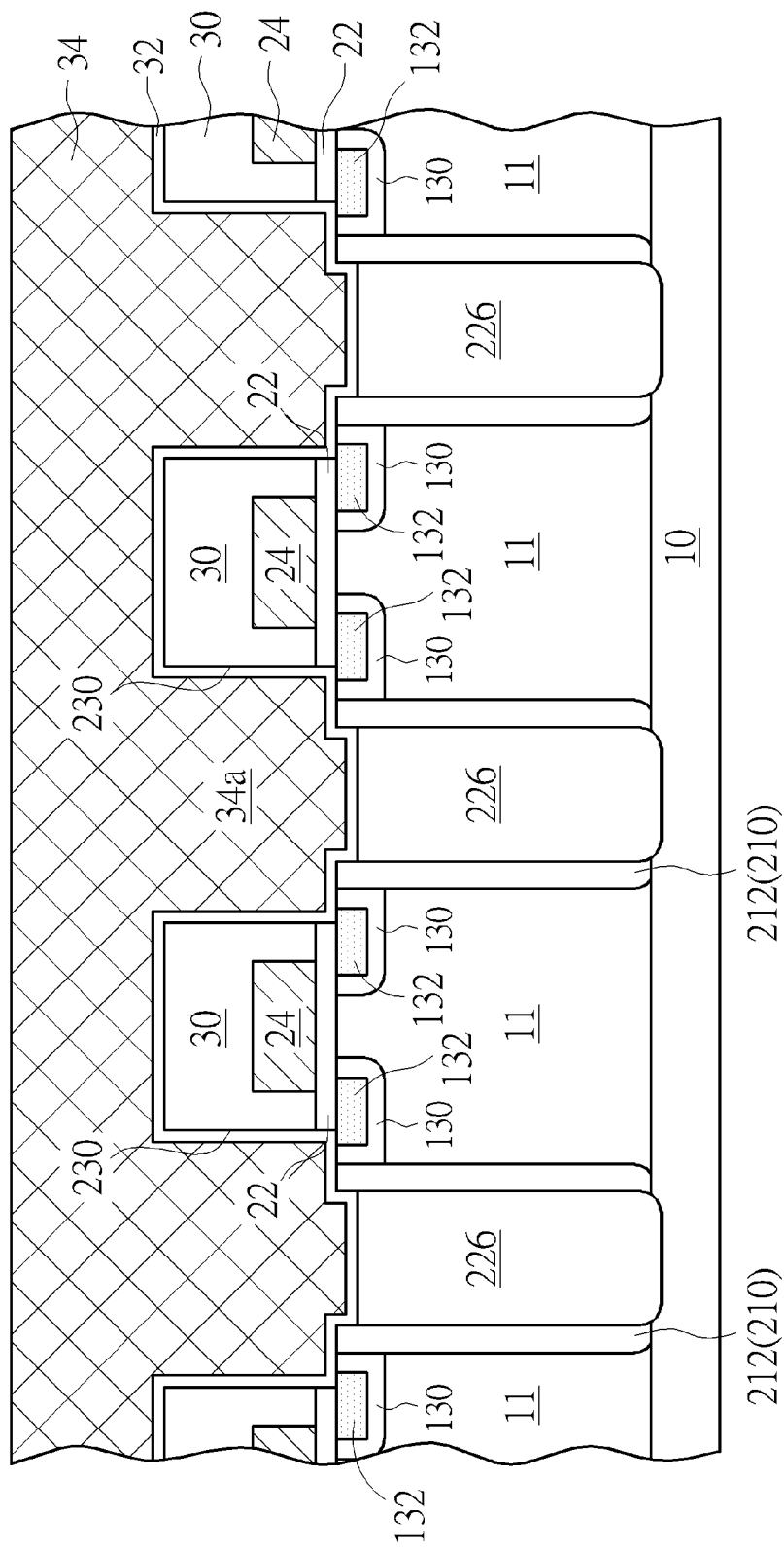

As shown in FIG. 10, contact holes are formed and metalized. To form the metalized contact holes, an inter-layer dielectric (ILD) layer 30 is first deposited. Then, contact holes 230 are formed in the ILD layer 30. The contact hole 230 reveals a portion of the ion well 130, the source doping region 132 and the silicon oxide layer 226. Barrier layer 32 and metal layer 34 are deposited to fill the contact holes 230, thereby forming the contact elements 34a in contact with the ion well 130 and the source doping regions 132.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method for fabricating a power semiconductor device, comprising:
   providing a semiconductor substrate;
   forming an epitaxial layer on the semiconductor substrate;
   forming a hard mask layer on the epitaxial layer;
   forming at least one opening in the hard mask layer;
   forming a spacer on a sidewall of the opening;
   etching the epitaxial layer through the opening to thereby form at least one first trench;
   depositing a dopant source layer on an interior surface of the first trench, on the spacer and on a top surface of the hard mask layer;
   thermally driving dopants from the dopant source layer into the epitaxial layer to thereby form a doping region in the first trench, the doping region comprising a first region closer to the interior surface of the first trench and a second region deeper into the epitaxial layer;
   removing the dopant source layer and the spacer to reveal upper corner portions of the first trench;
   filling the first trench with a sacrificial layer; and
   performing a dry etching process, using the hard mask layer as an etching hard mask, to completely etch away the sacrificial layer and the epitaxial layer in the first region, thereby forming a second trench.

2. The method for fabricating a power semiconductor device according to claim 1 wherein after forming the second trench, the method further comprises:
   depositing a silicon oxide layer into the second trench;
   removing the hard mask layer; and
   forming a gate oxide layer and a gate on a top surface of the epitaxial layer.

3. The method for fabricating a power semiconductor device according to claim 2 wherein after forming the gate, the method further comprises:
   performing an ion implantation process to form an ion well in the epitaxial layer; and
   forming a source doping region in the ion well.

4. The method for fabricating a power semiconductor device according to claim 1 wherein the dopant source layer comprises a boron doped silicate glass (BSG) or phosphorus doped silicate glass (PSG).

5. The method for fabricating a power semiconductor device according to claim 1 wherein the first region has a doping concentration that is higher than that of the second region.

6. The method for fabricating a power semiconductor device according to claim 5 wherein a doping concentration of the first region ranges between about $1E17$ atoms/cm$^3$ and $1E19$ atoms/cm$^3$, and a doping concentration of the second region is about $1E16$ atoms/cm$^3$.

7. The method for fabricating a power semiconductor device according to claim 1 wherein the first trench has a width that is smaller than a width of the opening, and a depth that is smaller than a thickness of the epitaxial layer.

8. The method for fabricating a power semiconductor device according to claim 1 wherein the second trench has a width that is substantially equal to a width of the opening.

9. The method for fabricating a power semiconductor device according to claim 8 wherein the second trench has a depth that is greater than a thickness of the epitaxial layer.

10. The method for fabricating a power semiconductor device according to claim 8 wherein the second trench has a depth that is smaller than a thickness of the epitaxial layer.

11. The method for fabricating a power semiconductor device according to claim 1 wherein the semiconductor substrate is an N type heavily doped semiconductor substrate and act as a drain of the power semiconductor device.

12. The method for fabricating a power semiconductor device according to claim 11 wherein the epitaxial layer is an N type epitaxial silicon layer and the doping region is P type.

13. The method for fabricating a power semiconductor device according to claim 11 wherein the epitaxial layer is a P type epitaxial silicon layer and the doping region is N type.

14. The method for fabricating a power semiconductor device according to claim 1 wherein the sacrificial layer comprises polysilicon.

* * * * *